United States Patent
Kohinata et al.

(10) Patent No.: US 8,178,646 B2
(45) Date of Patent: May 15, 2012

(54) METHOD FOR PRODUCING LIQUID-CRYSTALLINE POLYESTER POWDER

(75) Inventors: Yusaku Kohinata, Tokyo (JP); Tomoya Hosoda, Tsukuba (JP); Satoshi Okamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/073,739

(22) Filed: Mar. 28, 2011

(65) Prior Publication Data

US 2011/0240353 A1    Oct. 6, 2011

(30) Foreign Application Priority Data

Mar. 31, 2010   (JP) ................. 2010-081654

(51) Int. Cl.
   *C08G 63/02*   (2006.01)
   *C08G 64/00*   (2006.01)
(52) U.S. Cl. ................ 528/190; 528/271; 528/272
(58) Field of Classification Search ........... 528/190, 528/271, 272
    See application file for complete search history.

(56) References Cited

U.S. PATENT DOCUMENTS

| | | | |
|---|---|---|---|
| 6,512,079 B2 | 1/2003 | Okamoto et al. | |
| 6,867,280 B2 | 3/2005 | Okamoto et al. | |
| 7,094,359 B2 | 8/2006 | Okamoto et al. | |
| 2002/0143135 A1 | 10/2002 | Okamoto et al. | |
| 2003/0178602 A1 | 9/2003 | Okamoto et al. | |
| 2007/0026245 A1* | 2/2007 | Okamoto et al. | 428/458 |
| 2008/0048150 A1 | 2/2008 | Hosoda et al. | |

FOREIGN PATENT DOCUMENTS

| | | | |
|---|---|---|---|
| JP | 2002-146003 A | 5/2002 |
| JP | 2002-220444 A | 8/2002 |
| JP | 2003-268121 A | 9/2003 |
| JP | 2008-075063 A | 4/2008 |

* cited by examiner

*Primary Examiner* — Terressa Boykin
(74) *Attorney, Agent, or Firm* — Foley & Lardner LLP

(57) ABSTRACT

The present invention provides a method for producing a liquid-crystalline polyester powder, the method comprising: carrying out melt polycondensation of monomers and/or its acylated monomers to obtain a corresponding polyester having a flow initiation temperature of 240 to 300° C.; spreading and solidifying the polyester so as to be a layer thereof with a thickness of 1 cm or more: crushing the solidified substance to obtain a powder having a volume average particle diameter of 3 to 30 μm; and subjecting the powder to a heat treatment to obtain a powder having a flow initiation temperature higher than the flow initiation temperature of the liquid-crystalline polyester after the melt polycondensation.

11 Claims, No Drawings

METHOD FOR PRODUCING LIQUID-CRYSTALLINE POLYESTER POWDER

BACKGROUND OF THE INVENTION

1. Field of the Invention

The present invention relates to a method for producing a liquid-crystalline polyester powder.

2. Description of the Related Art

A liquid-crystalline polyester is preferably used as an injection molding material for the production of a molded article having a thin-wall portion and a molded article having a complicated shape since it is excellent in melt fluidity and also has high heat resistance and mechanical strength. Also, it has recently been studied to use, as a press molding material for the production of a comparatively large-sized molded article, a liquid-crystalline polyester powder in the form of fine particles (see, for example, JP-A-2008-75063)

The liquid-crystalline polyester powder is obtained by obtaining a liquid-crystalline polyester through melt polycondensation, solidifying and then crushing the liquid-crystalline polyester. However, there is a problem that, when a flow initiation temperature of the liquid-crystalline polyester is too high, although high heat resistance and mechanical strength are achieved, it is difficult to crush into fine particles. In order to solve such a problem, for example, JP-A-2003-268121 discloses that a liquid-crystalline polyester powder in the form of fine particles having an average particle diameter of 0.5 to 50 μm is obtained by crushing a liquid-crystalline polyester having a low flow initiation temperature of 200 to 270° C., and also discloses that heat resistance and mechanical strength are enhanced by raising the flow initiation temperature as a heat treatment after crushing.

SUMMARY OF THE INVENTION

According to the method described in JP-A-2008-75063, although a liquid-crystalline polyester powder in the form of fine particles is obtained, a fibrillar material is likely to be produced and thus the method may be unsuited for press molding. Thus, one of objectives of the present invention is to provide a method of producing a liquid-crystalline polyester powder which can be in the form of fine particles and is less likely to produce a fibrillar material.

In order to achieve the above object, the present invention provides a method for producing a liquid-crystalline polyester powder, the method comprising:

(i) a step of carrying out melt polycondensation of monomers and/or acylated monomers to obtain a corresponding liquid-crystalline polyester having a flow initiation temperature of 240 to 300° C.;

(ii) a step of spreading and solidifying the liquid-crystalline polyester so as to be a layer thereof with a thickness of 1 cm or more to obtain a solidified substance;

(iii) a step of crushing the solidified substance to obtain a powder having a volume average particle diameter of 3 to 30 μm; and (iv) a step of subjecting the powder to a heat treatment to obtain a powder having a flow initiation temperature higher than the flow initiation temperature of the liquid-crystalline polyester after the melt polycondensation.

According to the present invention, it is possible to obtain a liquid-crystalline polyester powder in the form of fine particles, which is less likely to produce a fibrillar material.

DETAILED DESCRIPTION OF PREFERRED EMBODIMENTS

In the present invention, a liquid-crystalline polyester powder can be produced by a method which comprises:

(i) a step of carrying out melt polycondensation of monomers and/or acylated monomers to obtain a corresponding liquid-crystalline polyester having a flow initiation temperature of 240 to 300° C.;

(ii) a step of spreading and solidifying the liquid-crystalline polyester so as to be a layer thereof with a thickness of 1 cm or more to obtain a solidified substance;

(iii) a step of crushing the solidified substance to obtain a powder having a volume average particle diameter of 3 to 30 μm; and (iv) a step of subjecting the powder to a heat treatment to obtain a powder having a flow initiation temperature higher than the flow initiation temperature of the liquid-crystalline polyester after the melt polycondensation.

The liquid-crystalline polyester, which constitutes the liquid-crystalline polyester powder produced in the present invention, is a polyester which exhibits optical anisotropy at the time of melting and forms an anisotropic melt at a temperature of 450° C. or lower. The liquid-crystalline polyester is preferably a liquid-crystalline polyester including a structural unit represented by the formula (1) shown below (hereinafter may sometimes be referred to as a structural unit (1)), a structural unit represented by the formula (2) shown below (hereinafter may sometimes be referred to as a structural unit (2)), and a structural unit represented by the formula (3) (hereinafter may sometimes be referred to as a structural unit (3)), the number of 2,6-naphthalenediyl groups accounting for 40% or more the total number of $Ar^1$, $Ar^2$ and $Ar^3$, because of small dielectric loss. Also, since the molecular chain of this liquid-crystalline polyester has high rigidity, a fibrillar material is likely to be produced by fine crushing. However, according to the method of the present invention, it is possible to effectively suppress the production of the fibrillar material.

$$-O-Ar^1-CO- \quad (1)$$

$$-CO-Ar^1-CO- \quad (2)$$

$$-O-Ar^3-O- \quad (3)$$

$Ar^1$ represents a 2,6-naphthalenediyl group, a 1,4-phenylene group or a 4,4'-biphenylylene group. $Ar^2$ and $Ar^3$ each independently represents a 2,6-naphthalenediyl group, a 1,4-phenylene group, a 1,3-phenylene group or a 4,4'-biphenylylene group. Hydrogen atoms existing in the groups represented by $Ar^1$, $Ar^2$ or $Ar^3$ each independently may be substituted with a halogen atom, an alkyl group having 1 to 10 carbon atoms or an aryl group having 6 to 20 carbon atoms.

Herein, examples of the halogen atom include a fluorine atom, a chlorine atom, a bromine atom and an iodine atom. Also, examples of the alkyl group include a methyl group, an ethyl group, a propyl group, a butyl group, a hexyl group, an octyl group and a decyl group, and the alkyl group may be linear, branched or cyclic. Also, examples of the aryl group include a phenyl group and a naphthyl group.

In the liquid-crystalline polyester, the number of 2,6-naphthalenediyl groups account for the total numbers of $Ar^1$, $Ar^2$ and $Ar^3$ is adjusted to 40% or more, thus making it possible to lower dielectric loss of the liquid-crystalline polyester. The ratio is preferably 50% or more, more preferably 60% or more, and still more preferably 70% or more.

In the liquid-crystalline polyester, the structural unit (1) is a structural unit derived from a predetermined aromatic hydroxycarboxylic acid, and the content is preferably from 30 to 80 mol %, more preferably from 40 to 70 mol %, and still more preferably from 45 to 65 mol %, based on the total amount of all structural units. Also, the structural unit (2) is a structural unit derived from a predetermined aromatic dicarboxylic acid, and the content is preferably from 10 to 35 mol %, more preferably from 15 to 30 mol %, and still more preferably from 17.5 to 27.5 mol %, based on the total amount of all structural units. Also, the structural unit (3) is a structural unit derived from a predetermined aromatic diol, and the content is preferably from 10 to 35 mol %, more preferably from 15 to 30 mol %, and still more preferably from 17.5 to 27.5 mol %, based on the total amount of all structural units. Also, it is preferred that the content of the structural unit (2) is substantially the same as that of the structural unit (3).

In a typical example of the liquid-crystalline polyester having high heat resistance and small dielectric loss, the content of a structural unit in which $Ar^1$ is a 2,6-naphthalenediyl group, as the structural unit (1), i.e., a structural unit derived from 2-hydroxy-6-naphthoic acid is preferably from 40 to 74.8 mol %, more preferably from 40 to 64.5 mol %, and still more preferably from 50 to 58 mol %, based on the total amount of all structural units; the content of a structural unit in which $Ar^2$ is a 2,6-naphthalenediyl group, as the structural unit (2), i.e. structural unit derived from 2,6-naphthalenedicarboxylic acid is preferably from 12.5 to 30 mol %, more preferably from 17.5 to 30 mol %, and still more preferably from 20 to 25 mol %, based on the total amount of all structural units; the content of a structural unit in which $Ar^2$ is a 1,4-phenylene group, as the structural unit (2), a structural unit derived from terephthalic acid is preferably from 0.2 to 15 mol %, more preferably from 0.5 to 12 mol %, and still more preferably from 2 to 10 mol %, based on the total amount of all structural units; the content of a structural unit in which $Ar^3$ is a 1,4-phenylene group, as the structural unit (3), a structural unit derived from hydroquinone is preferably from 12.5 to 30 mol %, more preferably from 17.5 to 30 mol %, and still more preferably from 20 to 25 mol %, based on the total amount of all structural units; and also the content of a structural unit derived from 2,6-naphthalenedicarboxylic acid is preferably 0.5 mol or more, and more preferably 0.6 mol or more, per mol of the total amount of the structural unit derived from 2,6-naphthalenedicarboxylic acid and the structural unit derived from terephthalic acid.

In the method for producing a liquid-crystalline polyester powder of the present invention, typically, a powdered monomer may be firstly charged in a charging step and then transferred to an acylation step, where the monomer is converted into an ester-forming derivative by acylation. A method of acylating a monomer prior to a melt polycondensation (described below) is preferable conducted because it is a simple, easy operation, while the monomer can also be used to the melt polycondensation.

Examples of the ester-forming derivative of a monomer having a carboxyl group (such as an aromatic hydroxycarboxylic acid or an aromatic dicarboxylic acid) include those in which the carboxyl group becomes a group having high reaction activity in acid chloride and acid anhydride so as to accelerate a reaction of producing a polyester), those in which the carboxyl group forms an ester along with alcohols, ethylene glycol and the like so as to produce a polyester by an ester exchange reaction, and the like.

Examples of the ester-forming derivative of a monomer having a phenolic hydroxyl group (such as an aromatic hydroxycarboxylic acid and an aromatic diol) include those in which the phenolic hydroxyl group forms an ester along with carboxylic acids so as to produce a polyester by an ester exchange reaction.

Among these methods, particularly preferred method is a method in which an aromatic hydroxycarboxylic acid and a monomer having a phenolic hydroxyl group, such as an aromatic diol are acylated by a fatty acid anhydride to obtain an ester-forming derivative (acylate), and then the ester-forming derivative is polymerized so as to cause ester interchange of an acyl group of this acrylate with a carboxyl group of a monomer having a carboxyl group to produce a liquid-crystalline polyester, so as to produce a liquid-crystalline polyester more simply and easily.

Such a method for producing a liquid-crystalline polyester is described, for example, in JP-A-2002-220444 or JP-A-2002-146003.

In the acylation, the use amount of the fatty acid anhydride is preferably from 1.0 to 1.2 equivalent, and more preferably from 1.05 to 1.1 equivalent, per equivalent of the phenolic hydroxyl group. When the use amount of the fatty acid anhydride is less than 1.0 equivalent, the reaction system tends to cause clogging as a result of sublimation of the acrylate and the raw monomer during polymerization. In contrast, when the use amount is more than 1.2 equivalent, coloration of the obtained liquid-crystalline polyester tends to become severe.

The acylation is preferably performed at 130 to 180° C. for 5 minutes to 10 hours, and more preferably at 140 to 160° C. for 10 minutes to 3 hours.

The fatty acid anhydride used in the acylation is preferably acetic anhydride, propionic anhydride, butyric anhydride, isobutyric anhydride or a mixture of two or more kinds selected therefrom, and particularly preferably acetic anhydride, from the viewpoint of costs and handling properties.

The acylated monomers obtained above may be subjected to a melt polycondensation (in a melt polycondensation step (i)) to provide a corresponding liquid-crystalline polyester having a flow initiation temperature of 240 to 300° C.

At this time, the melt polycondensation following the acylation is preferably performed while raising the temperature within a range from 130 to 400° C. at a rate of 0.1 to 50° C./minute, and more preferably from 150 to 350° C. at a rate of 0.3 to 5° C./minute.

Also, in the melt polycondensation, the amount of the acyl group of the acrylate is preferably from 0.8 to 1.2 equivalent per equivalent of the carboxyl group.

In the case of performing the acylation and/or the melt polycondensation, in order to move equilibrium by Le Chatelier-Braun principle (principle of mobile equilibrium), it is preferred to distill the by-produced fatty acid and unreacted fatty acid anhydride out of the system by vaporization or the like.

The acylation and melt polycondensation may be performed in the presence of a catalyst. It is possible to use, as the catalyst, those which have conventionally been known as a catalyst for polymerization of a polyester, and examples thereof include metal salt catalysts such as magnesium acetate, stannous acetate, tetrabutyl titanate, lead acetate, sodium acetate, potassium acetate and antimony trioxide; and organic compound catalysts such as N,N-dimethylaminopyridine and N-methylimidazole.

However, the catalyst containing metal exerts a large influence on electrical characteristics in the case of producing a semiconductive resin belt. Therefore, among the catalyst described above, a heterocyclic compound having two or more nitrogen atoms, such as N,N-dimethylaminopyridine and N-methylimidazole is preferably used (see, for example, JP-A-2002-146003).

Typically, the catalyst is charged simultaneously with raw monomers and it is not necessarily required to remove even after the acylation. In case the catalyst is not removed, the catalyst can be transferred, as it is, to the melt polycondensation step from the acylation step.

The flow initiation temperature of the liquid-crystalline polyester with low polymerization degree obtained in the melt polycondensation step (i) is preferably 300° C. or lower, taking properties of discharging (ease of extraction) from the reaction vessel into consideration. The flow initiation temperature is preferably from 240 to 300° C., and more preferably from 250 to 280° C. When the flow initiation temperature of the liquid-crystalline polyester after the melt polycondensation reaction is controlled within the above range, liquid-crystalline polyester particles tend to be produced more easily by mechanically crushing the liquid-crystalline polyester. Also, there is an advantage that workability in the case of extracting liquid-crystalline polyester from the reaction kettle becomes satisfactory after the melt polycondensation reaction.

As used herein, the term "flow initiation temperature" refers to a temperature at which a melt viscosity of a liquid-crystalline polyester becomes 4,800 Pa·s or less under a pressure of 9.8 MPa (100 kg/cm$^2$) in the evaluation of the melt viscosity by a flow tester. Also, this "flow initiation temperature" is known to a person with an ordinary skill in the art as the standard of a molecular weight of the liquid-crystalline polyester (see, for example, edited by Naoyuki Koide, "Synthesis, Molding and Application of Liquid-crystalline Polymer", pp. 95-105, CMC, published on Jun. 5, 1987).

After the melt polycondensation step (i), the liquid-crystalline polyester is spread and solidified to be a layer thereof with a thickness of 1 cm or more in a cooling and solidification step (ii), to obtain a solidified substance.

In transferring the liquid-crystalline polyester into the solidification step (ii), the liquid-crystalline polyester may be taken out from the reaction vessel so that the thickness of the layer thereof after solidification becomes 1 cm or more (for example, about 2 cm). With this step, the degree of orientation of the molecular chain of the liquid-crystalline polyester can be lowered, and therefore a fibrillar material is hardly produced by the subsequent mechanical crushing.

After the solidification step (ii), the solidified substance of the liquid-crystalline polyester is crushed (in crushing step (iii)). The crushing can be conducted in two stages. For example, the liquid-crystalline polyester may be firstly coarsely crushed and then secondly may be finely crushed. In the coarse crushing step, the liquid-crystalline polyester is coarsely crushed to a predetermined particle size (for example, 0.2 to 3.0 mm). The coarse crushing may be either dry or wet type coarse crushing.

After the coarse crushing, the liquid-crystalline polyester may be finely crushed to a predetermined particle size (for example, 3 to 30 μm). The fine crushing may be either dry or wet type fine crushing. By such crushing step(s), a powder (of the liquid-crystalline polyester) having a predetermined particle size of a prepolymer is obtained.

A preferred crushing treatment using these coarse crushing and fine crushing will be described. In the coarse crushing, a massive liquid-crystalline polyester after the melt polycondensation reaction is converted into coarsely crushed particle having a volume average particle diameter of about 0.2 to 3.0 mm. In such the coarse crushing, for example, methods using a jaw crusher, a gyratory crusher, a cone crusher, a roll crusher, an impact crusher, a hammer crusher, a coarse crushing cutter and the like can be applied. It is particularly preferred to use a coarse crushing cutter type crusher.

Examples of the method of fine crushing include methods using a rod mill, a ball mill, a vibration rod mill, a vibration ball mill, a pan mill, a roller mill, an impact mill, a disk shaped mill, a stirring/frictional crushing mill, a fluid energy mill, a jet mill and the like. It is particularly preferred to use a jet mill.

As described above, since the operation of crushing of the liquid-crystalline polyester is performed in two stages (including the coarse crushing step and the fine crushing step), a prepolymer having an even predetermined particle size (i.e., a volume average particle diameter of 3 to 30 μm) can be obtained within a short time.

After the crushing step (iii), the powder of the prepolymer with a volume average particle diameter of 3 to 30 μm is subjected to a heat treatment (in heat treatment step (iv)) to obtain a powder having a flow initiation temperature higher than the flow initiation temperature of the liquid-crystalline polyester after the melt polycondensation. In the heat treatment step (iv), the powder of the prepolymer is subjected to solid phase polymerization to prepare a solid powder.

Namely, this step can be carried out by the operation of subjecting the liquid-crystalline polyester after crushing to a heat treatment in a solid phase state under an atmosphere of an inert gas such as nitrogen at a reaction temperature of 240 to 320° C. for 5 minutes to 30 hours. The reaction temperature is preferably from 260 to 310° C., and more preferably from 270 to 300° C. The flow initiation temperature of the liquid-crystalline polyester after the heat treatment is preferably 310° C. or higher. When the flow initiation temperature of the liquid-crystalline polyester is 310° C. or higher, the molded article obtained from liquid-crystalline polyester particles is excellent in both heat resistance and mechanical strength. Particularly, in case the molded article is used as electrical and electronic components and the like, there is a tendency that blister defects such as blister are less likely to occur even when these components are exposed to the process such as solder reflow.

In the heat treatment step (iv) described above, particles constituting the liquid-crystalline polyester powder may adhere to each other, or fusion due to heat partially occurs, resulting in increased average particle diameter of the liquid-crystalline polyester powder. In that case, the average particle diameter of the finally obtained liquid-crystalline polyester powder may become larger, thus making it difficult to obtain a fine liquid-crystalline polyester powder.

In contrast, in the present invention, the liquid-crystalline polyester powder obtained after the heat treatment is subjected to a cracking treatment which removes adhesion and fusion between particles, and then subjected to a treatment which enables an average particle diameter equal to or less than that in the fine crushing step, thus making it possible to obtain a fine liquid-crystalline polyester powder, easily.

After the heat treatment step (iv), the powder obtained in the step (iv) can be optionally cracked (in cracking step (v)) to obtain a powder having a volume average particle diameter smaller than or equal to the volume average particle diameter of the powder obtained in the crushing step (iii). The cracking can be performed in the same manner as in the preparation of the liquid-crystalline polyester powder in the fine crushing step. For example, it is preferred that the liquid-crystalline polyester powder is mechanically crushed. From the viewpoint of costs required to this crushing treatment, and productivity, a crushing method using a jet mill is preferred.

With or without cracking step (v), the powder of prepolymer has a desired polymerization degree (flow initiation temperature) by solid phase polymerization. As a result, it becomes possible to industrially produce a powder of liquid-crystalline polyester powder having a flow initiation temperature of 310° C. or higher and a volume average particle diameter of 0.5 to 30 µm.

The liquid-crystalline polyester composition produced by using the modified liquid-crystalline polyester powder and filler described above will be described. The use amount of the filler is preferably 20% by volume or more, and more preferably 25% by volume or more, based on the total volume of the modified liquid-crystalline polyester powder and the filler, although it varies depending on the objective purposes. Also, the amount of the filler is preferably 40% by volume or less based on the total volume of the modified liquid-crystalline polyester powder and the filler from the viewpoint of improving moldability in the case of producing a large-sized molded article, particularly moldability in the case of producing a molded plate by press molding.

It is possible to blend, as the filler, fibrous, powdered, and tabular inorganic and organic fillers. Examples of the fibrous filler include a glass fiber, a asbestos fiber, a silica fiber, a silica alumina fiber, a carbon fiber, a zirconia fiber, a boron nitride fiber, a silicon nitride fiber, a boron fiber, a carbon titanate fiber, a fiber of silicate such as wollastonite, a magnesium sulfate fiber, aluminum borate fiber, and inorganic fibrous substances such as fibrous materials made of metals such as stainless steel, aluminum, titanium, copper and brass.

Examples of the powdered filler include carbon black, graphite, silica, porous silica, quartz powder, glass beads, milled glass fiber, glass balloon, glass powder, calcium silicate, aluminum silicate, kaolin, clay, diatomaceous earth, silicate such as wollastonite; oxides of metals, such as aluminum nitride, boron nitride, dielectric ceramic powder, iron oxide, titanium oxide, zinc oxide, nickel oxide, antimony trioxide, magnesium oxide, silicon oxide and alumina; carbonates of metals, such as calcium carbonate and magnesium carbonate; sulfates of metals, such as calcium sulfate and barium sulfate; ferrites such as manganese zinc ferrite, nickel zinc ferrite, barium ferrite and strontium ferrite; various metal powders such as silicon carbide, silicon nitride, boron nitride, iron and nickel powders; alloy powder containing these metals; and the like.

Also, examples of the tubular filler include mica, glass flake, talc, tubular alumina, various metal foils and the like.

Examples of the organic filler include heat-resistant high-strength synthetic fibers such as an aromatic polyester fiber, a liquid-crystallineline polymer fiber, an aromatic polyamide and a polyimide fiber. It is also possible to use high-melting point organic fibrous substances such as a polyamide, a fluororesin, a polyester resin and an acrylic resin.

These inorganic and organic fillers may be used alone, or two or more kinds of them may be used in combination. Use of a fibrous filler in combination of a granular or tubular filler is particularly preferred combination so as to be simultaneously provided with mechanical strength, dimensional accuracy and electrical properties.

In the fillers exemplified above, the volume average particle diameter of the filler is preferably from about 0.5 to 50 µm, and more preferably from about 1 to 30 µm, from the viewpoint of an improving properties of mixing with the modified liquid-crystalline polyester powder.

In the present invention, various functions can be imparted to a large-sized molded article by these fillers and the filler is selected according to the objective functions. For the purpose of imparting a mechanical strength to the molded article, fibrous fillers such as a glass fiber, an alumina fiber, a carbon fiber and an aluminum borate fiber; and tubular fillers such as mica, glass flake, talc and tubular alumina are exemplified, and a glass fiber, an alumina fiber, a carbon fiber, mica and talc are more preferred.

For the purpose of imparting magnetism to the molded article, various metal powders, powders of ferrites such as manganese zinc ferrite, nickel zinc ferrite, barium ferrite and strontium ferrite, iron and nickel powders, and alloy powders thereof are exemplified, and various metal powders such as manganese zinc ferrite, nickel zinc ferrite, iron and nickel powders, and alloy powders containing these metals are more preferred.

For the purpose of imparting thermal conductivity to the molded article, it is possible to use alumina, silica, aluminum nitride, boron nitride, magnesium oxide, silicon nitride, silicon oxide, silicon carbide, metal powder or oxide of metal among those exemplified above.

For the purpose of imparting dielectric characteristics to the molded article, fillers made of a high dielectric material or a low dielectric material (hereinafter sometimes referred to as a "dielectric filler") may be used. Examples of filler made of the high dielectric material include a dielectric ceramic powder having a dielectric constant of 100 or more among those exemplified above, and more specifically a dielectric ceramic powder containing at least one kind of metal selected from the group consisting of titanium, barium, strontium, zinc, potassium, calcium, zirconium, tin, neodymium, bismuth, samarium, lithium and tantalum.

Examples of the filler made of the low dielectric material include a filler made of a so-called hollow body and a filler made of a fluororesin as the low dielectric resin.

The molded article produced by using a liquid-crystalline polyester composition containing the above liquid-crystalline polyester powder and filler, particularly the molded article produced by press molding of the liquid-crystalline polyester composition will be described below. As long as the desired effects of the filler to be contained are not impaired, it is also possible to mix additives other than the fillers in the liquid-crystalline polyester composition of the present invention. In the case of mixing these additives, it is possible to mix resins other than the liquid-crystallineline polymer and to mix known coupling agents, antioxidants, ultraviolet absorbers, heat stabilizers, coloring materials and the like.

The molding conditions of the press molding will be described below. It is preferred to process under the conditions that a processing temperature (Tp) at the time of press molding satisfies a relation shown below relative to a flow initiation temperature of a liquid-crystalline polyester composition, i.e. a flow initiation temperature of liquid-crystalline polyester existing in the liquid-crystalline polyester composition.

$$(\text{Flow initiation temperature}-10)\,[^\circ\text{C.}] \leq Tp \leq (\text{Flow initiation temperature}+100)+[^\circ\text{C.}]$$

In case the processing temperature (Tp) is lower than (flow initiation temperature−10) [° C.], there is a tendency that the liquid-crystalline polyester composition is not sufficiently melted, thus making it difficult to obtain a molded article having a sufficient strength. In contrast, in case the processing temperature (Tp) is higher than (flow initiation temperature+100) [° C.], the liquid-crystalline polyester per se tends to deteriorate by thermal decomposition.

The pressure at the time of press molding is preferably 400 kgf/cm$^2$ or less, more preferably 200 kgf/cm$^2$ or less, and still more preferably 100 kgf/cm$^2$, from the viewpoint of reducing warp of the resulting molded article. The retention time at a maximum temperature during press molding is preferably from 1 to 180 minutes, and more preferably from 5 to 120 minutes, from the viewpoint of processability and productivity.

The press molding may be carried out in vacuum or under an inert gas (nitrogen, etc.) atmosphere.

According to the present invention, in order to obtain a comparatively large-sized molded article which is excellent in dispersibility of the filler, characteristic dispersion of a molded plate can be satisfactorily prevented. Such a molded article is capable of producing a large-sized molded plate measuring 250×250 mm, which cannot be realized by an injection molding method used widely as a fabrication method of a liquid-crystalline polyester composition.

Also, the liquid-crystalline polyester composition to be applied to the present invention enables the productions of various large-sized molded articles, and also enables processing into a comparatively small-sized molded article or a film-shaped molded article. Furthermore, it is possible to process into any shape, for example, cylindrical and rectangular shapes, and shapes of mechanical components such as gear and bearing by widely changing a mold used for press molding, and also to process by cutting a molded article, which has been formed into a sheet shape, into a desired shape.

As described above, the molded article which is excellent in dispersibility of the filler is suited for use as members of electrical and electronic components. A circuit board will be described as an example of these components. The circuit board can be produced by forming a conductor layer on a molded article and it is possible to use, as means for forming the conductor layer, means used widely in the relevant field, for example, a method in which a metal foil such as a copper foil is laminated on a molded article using a hot press, a method in which a metal foil is laminated using an adhesive and the like.

It is also possible to employ a method in which a conductor layer is formed on a molded article by a sputtering method, an ion plating method, a vacuum deposition method, an electroless plating method and the like. Furthermore, a conductor layer may be laminated using electroplating after forming the conductor layer by the method exemplified above. For the purpose of enhancing adhesion between a molded article surface and a conductor layer before forming the conductor layer, the molded article may be subjected to various surface treatments such as an ultraviolet ray treatment, a plasma treatment, a corona treatment, an acid alkali treatment and a sand blasting treatment.

After forming the conductor layer in such a manner, any circuit can be formed according to various purposes, and the above antenna substrate and printed circuit board can be produced by the formation of the circuit.

As described above, the molded article in the present invention can be used as members of electrical and electronic components, particularly preferably, and may be used for other purposes. Specifically, the molded article can be used as, in addition to electrical and electronic components, such as connector, socket, relay component, coil bobbin, optical pickup, resonator, computer related component, components of household electric appliances, such as VTR, television, iron, air conditioner, stereo, vacuum cleaner, refrigerator, rice cooker and lighting equipment; components of lighting equipment, such as lamp reflector and lamp holder; components of acoustic products, such as compact disk, laser disk and speaker; components of communications equipment, such as ferrule for optical fiber, telephone components, facsimile components and modem; copying machine/printer related components, such as separation claw and heater holder; mechanical components such as impeller, fan gear, gear, bearing, motor components and case; automobile components such as automotive mechanism components, engine components, engine indoor components, electrical components and inner packaging components; kitchen utensils such as microwave cooking pot and ovenware; heat and sound insulating materials such as floor material and wall material; supporting materials such as beam and pillar; construction materials such as roof materials, or materials for civil engineering and building construction; aircraft, space craft, components for space equipment; radiation facility members such as nuclear reactor; marine facility members, cleaning jig, optical equipment components, valves, pipes, nozzles, filters, membrane, medical device components and medical materials, sensor components, sanitary fixtures, sporting goods, leisure goods and the like.

EXAMPLES

Examples of the present invention will be described below, but the present invention is not limited thereto. The measurement method and the evaluation method are as follows.

<Volume Average Particle Diameter of Powder>

A powder was dispersed in water containing about several tens of ppm of a dispersing agent ("EMULGEN": nonionic surfactant, manufactured by Kao Corporation) dissolved therein, and then the measurement was performed using a laser diffraction particle size distribution analyzer ("LMS-30", manufactured by SEISHIN ENTERPRISE Co., Ltd.).

Example 1

In a reactor equipped with a stirrer, a torque meter, a nitrogen introducing tube, a thermometer and a reflux condenser, 1034.99 g (5.5 mol) of 2-hydroxy-6-naphthoic acid, 272.52 g (2.475 mol, 0.225 mol, excessive charge) of hydroquinone, 378.33 g (1.75 mol) of 2,6-naphthalenedicarboxylic acid, 83.07 g (0.5 mol) of terephthalic acid, 1226.87 g (12.0 mol) of acetic anhydride and 0.17 g of 1-methylimidazole as a catalyst were charged, followed by stirring at room temperature for 15 minutes and further heating while stirring. When the inner temperature reached 145° C., the mixture was stirred for 1 hour while maintaining at the same temperature (145° C.).

Next, while distilling off the distilled by-produced acetic acid and unreacted acetic anhydride, the reaction solution was heated from 145° C. to 310° C. over 3 hours and 30 minutes. While maintaining at the same temperature (310° C.) for 3 hours, a liquid-crystalline polyester was taken out in a vat in a molten state so that the thickness becomes 2 cm. The liquid-crystalline polyester thus obtained was solidified by cooled to about room temperature and then crushed by a vertical crusher ("Orient VM-16", manufactured by SEISHIN ENTERPRISE Co., Ltd.) to obtain a liquid-crystalline polyester (prepolymer) in the form of a coarsely crushed powder having a volume average particle diameter of about 0.5 mm. The flow initiation temperature of this liquid-crystalline polyester was measured. As a result, it was 266° C. The liquid-crystalline polyester exhibited optical anisotropy in a molten state at a temperature of 280° C. or higher.

Next, the liquid-crystalline polyester in the form of the coarsely crushed powder was finely crushed using a jet mill ("STJ-200", manufactured by SEISHIN ENTERPRISE Co., Ltd.) under the conditions of a nozzle pressure of 0.7 MPa and an amount of a crushing treatment of 3.0 kg/hr to obtain a liquid-crystalline polyester powder (A) having a volume average particle diameter of 8.4 μm. The obtained liquid-crystalline polyester powder (A) was observed by a scanning electron microscope. As a result, it had a particular shape.

The obtained liquid-crystalline polyester powder (A) was subjected to a heat treatment of heating from room temperature to 250° C. over 1 hour under a nitrogen atmosphere, heating from 250° C. to 292° C. over 7 hours, and then heating at the same temperature for 5 hours after reaching 292° C.

After the heat treatment, the liquid-crystalline polyester powder (B) was cooled, taken out and then subjected to a cracking treatment under the conditions of a nozzle pressure of 0.7 MPa using a jet mill ("STJ-200", manufactured by SEISHIN ENTERPRISE Co., Ltd.) to obtain a liquid-crystalline polyester powder (C) having a volume average particle diameter of 8.4 μm and a flow initiation temperature of 325° C. The obtained liquid-crystalline polyester powder (C) was observed by a scanning electron microscope. As a result, it had a particular shape.

Comparative Example

In a reactor equipped with a stirrer, a torque meter, a nitrogen gas introducing tube, a thermometer and a reflux condenser, 1034.99 g (5.5 mol) of 2-hydroxy-6-naphthoic acid, 272.52 g (2.475 mol, 0.225 mol, excessive charge) of hydroquinone, 378.33 g (1.75 mol) of 2,6-naphthalenedicarboxylic acid, 83.07 g (0.5 mol) of terephthalic acid, 1226.87 g (12.0 mol) of acetic anhydride and 0.17 g of 1-methylimidazole as a catalyst were charged, followed by stirring at room temperature for 15 minutes and further heating while stirring. When the inner temperature reached 145° C., the mixture was stirred for 1 hour while maintaining at the same temperature (145° C.)

Next, while distilling off the distilled by-produced acetic acid and unreacted acetic anhydride, the reaction solution was heated from 145° C. to 310° C. over 3 hours and 30 minutes. While maintaining at the same temperature (310° C.) for 3 hours, a liquid-crystalline polyester was taken out in a vat in a molten state so that the thickness becomes 0.2 cm. The liquid-crystalline polyester thus obtained was solidified by cooled to about room temperature and then crushed by a vertical crusher ("Orient VM-16", manufactured by SEISHIN ENTERPRISE Co., Ltd.) to obtain a liquid-crystalline polyester (prepolymer) in the form of a coarsely crushed powder having a volume average particle diameter of about 0.1 to 1 mm. The flow initiation temperature of this liquid-crystalline polyester was measured. As a result, it was 266° C. The liquid-crystalline polyester exhibited optical anisotropy in a molten state at a temperature of 280° C. or higher.

Next, the liquid-crystalline polyester in the form of coarsely crushed powder was finely crushed using a jet mill ("STJ-200", manufactured by SEISHIN ENTERPRISE Co., Ltd.) under the conditions of a nozzle pressure of 0.7 MPa and an amount of a crushing treatment of 4.0 kg/hr to obtain a liquid-crystalline polyester powder (A'). The obtained liquid-crystalline polyester powder (A') was observed by a scanning electron microscope. As a result, it had a fibrillar shape.

The obtained liquid-crystalline polyester powder (A') was subjected to a heat treatment of heating from room temperature to 250° C. over 1 hour under a nitrogen atmosphere, heating from 250° C. to 292° C. over 7 hours, and then heating at the same temperature for 5 hours after reaching 292° C. After the heat treatment, the liquid-crystalline polyester powder (B') was cooled, taken out and then subjected to a cracking treatment under the conditions of a nozzle pressure of 0.7 MPa using a jet mill ("STJ-200", manufactured by SEISHIN ENTERPRISE Co., Ltd.) to obtain a liquid-crystalline polyester powder (C') having a volume average particle diameter of 8.8 μm and a flow initiation temperature of 320° C. The obtained liquid-crystalline polyester powder (C') was observed by a scanning electron microscope. As a result, it had a fibrillar shape.

What is claimed is:

1. A method for producing a liquid-crystalline polyester powder, the method comprising:
   (i) a step of carrying out melt polycondensation of monomers and/or acylated monomers to obtain a corresponding liquid-crystalline polyester having a flow initiation temperature of 240 to 300° C.;
   (ii) a step of spreading and solidifying the liquid-crystalline polyester so as to be a layer thereof with a thickness of 1 cm or more to obtain a solidified substance;
   (iii) a step of crushing the solidified substance to obtain a powder having a volume average particle diameter of 3 to 30 μm; and
   (iv) a step of subjecting the powder to a heat treatment to obtain a powder having a flow initiation temperature higher than the flow initiation temperature of the liquid-crystalline polyester after the melt polycondensation.

2. The method according to claim 1, wherein the solidified substance is crushed in the step (iii) by mechanical crushing using a jet mill.

3. The method according to claim 1, which further comprises:
   (v) a step of cracking the powder obtained in the step (iv) to obtain a powder having a volume average particle diameter smaller than or equal to the volume average particle diameter of the powder obtained in the step (iii).

4. The method according to claim 3, wherein the powder obtained in the step (iv) is crushed in the step (v) by mechanical crushing using a jet mill.

5. The method according to claim 1, wherein the liquid-crystalline polyester has a structural unit represented by the formula (1) shown below, a structural unit represented by the formula (2) shown below and a structural unit represented by the formula (3), the number of 2,6-naphthalenediyl groups accounting for 40% or more the total number of $Ar^1$, $Ar^2$ and $Ar^3$:

   (1)

   (2)

   (3)

wherein $Ar^1$ represents a 2,6-naphthalenediyl group, a 1,4-phenylene group or a 4,4'-biphenylylene group;
   $Ar^2$ and $Ar^3$ each independently represents a 2,6-naphthalenediyl group, a 1,4-phenylene group, a 1,3-phenylene group or a 4,4'-biphenylylene group, and;
   hydrogen atoms existing in the groups represented by $Ar^1$, $Ar^2$ or $Ar^3$ each independently may be substituted with a halogen atom, an alkyl group having 1 to 10 carbon atoms or an aryl group having 6 to 20 carbon atoms.

6. A composition comprising a filler and the liquid-crystalline polyester powder obtained by the method according to claim 1.

7. The composition according to claim 6, wherein the content of the filler is 20% by volume or more based on the total volume of the liquid-crystalline polyester powder and the filler.

8. A molded article produced by press molding the liquid-crystalline polyester powder obtained by the method according to claim 1.

9. A molded article produced by press molding the composition according to claim 6.

10. A circuit board produced by forming a conductor circuit layer on the molded article according to claim 8.

11. A circuit board produced by forming a conductor circuit layer on the molded article according to claim 9.

* * * * *